United States Patent
Dunec et al.

(10) Patent No.: US 7,354,787 B2
(45) Date of Patent: Apr. 8, 2008

(54) ELECTRODE DESIGN AND POSITIONING FOR CONTROLLED MOVEMENT OF A MOVEABLE ELECTRODE AND ASSOCIATED SUPPORT STRUCTURE

(75) Inventors: John L. Dunec, Palo Alto, CA (US); Eric Peeters, Fremont, CA (US); Armin R. Volkel, Palo Alto, CA (US); Michel A. Rosa, Santa Clara, CA (US); Dirk DeBruyker, Palo Alto, CA (US); Thomas Hantschel, Menlo Park, CA (US)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 11/096,840

(22) Filed: Mar. 30, 2005

(65) Prior Publication Data
US 2005/0167769 A1 Aug. 4, 2005

Related U.S. Application Data

(62) Division of application No. 10/136,683, filed on Apr. 30, 2002, now Pat. No. 6,891,240.

(51) Int. Cl.
*H01L 21/00* (2006.01)

(52) U.S. Cl. .............. 438/52; 257/418; 257/E21.327; 200/181

(58) Field of Classification Search .............. 438/52; 257/418, E21.327; 200/181
See application file for complete search history.

(56) References Cited

U.S. PATENT DOCUMENTS

| | | | | |
|---|---|---|---|---|
| 5,278,368 A * | 1/1994 | Kasano et al. | | 200/181 |
| 5,367,136 A * | 11/1994 | Buck | | 200/600 |
| 5,544,001 A * | 8/1996 | Ichiya et al. | | 361/233 |
| 5,578,976 A * | 11/1996 | Yao | | 333/262 |
| 5,638,946 A * | 6/1997 | Zavracky | | 200/181 |
| 5,658,698 A * | 8/1997 | Yagi et al. | | 430/11 |
| 6,057,520 A * | 5/2000 | Goodwin-Johansson | | 200/181 |
| 6,071,752 A * | 6/2000 | Furlani et al. | | 438/52 |
| 6,373,682 B1 * | 4/2002 | Goodwin-Johansson | | 361/278 |
| 6,384,353 B1 * | 5/2002 | Huang et al. | | 200/181 |
| 6,384,952 B1 * | 5/2002 | Clark et al. | | 359/224 |
| 6,768,403 B2 * | 7/2004 | Hsu et al. | | 335/78 |
| 6,856,068 B2 * | 2/2005 | Miller et al. | | 310/311 |
| 2001/0053016 A1 * | 12/2001 | Nelson | | 359/291 |
| 2002/0191267 A1 * | 12/2002 | Flanders et al. | | 359/254 |
| 2003/0006125 A1 * | 1/2003 | Hallbjorner | | 200/36 |
| 2003/0012488 A1 * | 1/2003 | Staple et al. | | 385/18 |
| 2004/0013346 A1 * | 1/2004 | Ruan et al. | | 385/17 |

* cited by examiner

*Primary Examiner*—B. William Baumeister
*Assistant Examiner*—Steven J. Fulk
(74) *Attorney, Agent, or Firm*—Kent Chen

(57) ABSTRACT

A MEMS system including a fixed electrode and a suspended moveable electrode that is controllable over a wide range of motion. In traditional systems where an fixed electrode is positioned under the moveable electrode, the range of motion is limited because the support structure supporting the moveable electrode becomes unstable when the moveable electrode moves too close to the fixed electrode. By repositioning the fixed electrode from being directly underneath the moving electrode, a much wider range of controllable motion is achievable. Wide ranges of controllable motion are particularly important in optical switching applications.

16 Claims, 8 Drawing Sheets

ELECTRODE DESIGN AND POSITIONING FOR CONTROLLED MOVEMENT OF A MOVEABLE ELECTRODE AND ASSOCIATED SUPPORT STRUCTURE

CROSS-REFERENCE TO RELATED APPLICATIONS

This is a divisional of U.S. application Ser. No. 10/136,683 filed Apr. 30, 2002 now U.S. Pat. No. 6,891,240 by the same inventors, and claims priority therefrom. This divisional application is being filed in response to a restriction requirement in that prior application and contains additional claims to the restricted subject matter. The contents of the original U.S. application Ser. No. 10/136,683 are hereby incorporated by reference in its entirety.

BACKGROUND

MicroElectroMechanical systems (MEMS) routinely use suspended micromechanical moveable electrode structures as electrostatically actuated mechanical members for both sensor and actuator based devices. Different methods exist for creating a support structure to suspend a moveable electrode structure. One method for suspending such a moveable electrode uses cantilevered members that are fixed to a substrate on one end and fixed to the movable electrode structure on the other end. In an alternate embodiment, the cantilever is made of, or coated with a conducting material and the cantilever itself serves as the moving electrode. The mechanical flexibility of the cantilever (e.g. bending) and/or motion at the fixed end(s) (e.g. hinge or flexible connection) allows for the motion of the suspended electrode. In some cases, the sensor or actuator device is based on motion of cantilever as such without an additional movable structure at the end of the cantilever. Such cantilevers are typically fixed-free or fixed-simply supported cantilevers.

A second method of suspending one or more moveable electrodes utilizes a plurality of cantilevers that support a moveable member which either serves as a moveable electrode or has mounted upon it moveable electrodes. A fixed electrode serves as an actuator to control movement of the moveable electrode structure through the application of an electric potential difference between the fixed electrode and the moveable electrode structure. The fixed electrode is typically positioned beneath the suspended moveable electrode to form a parallel plate capacitor like structure, with the fixed electrode acting as a first plate and the suspended moveable electrode acting as a second plate. The electric potential applied to the electrodes generates electrostatic forces that move or deform the support mechanism supporting the moveable electrode or the moveable electrode itself. Such support mechanisms may include bendable or otherwise deformable cantilevers.

Typical cantilever applications include micro sized relays, antennas, force sensors, pressure sensors, acceleration sensors and electrical probes. Recently, considerable attention has been focused on using cantilever arrays to develop low power, finely tunable micro-mirror arrays to redirect light in optical switching applications. Such a structure is described in U.S. Pat. No. 6,300,665 B1 entitled "Structure for an Optical Switch on a Silicon on Insulator Substrate" hereby incorporated by reference.

One problem with such cantilever structures is the limited amount of controllable motion that can be achieved with traditional arrangements of the cantilever and electrode. When a voltage difference is applied between two electrically conducting bodies separated by an insulating medium (for example air), the electrostatic force between the two bodies is inversely proportional to the square of the distance between the bodies. Thus when the moveable electrode is moved in closer proximity to the fixed electrode, as often occurs when a greater range of motion is attempted, strong electrostatic forces between the fixed electrode and the moveable electrode results in a "pull-in" or "snap-down" effect that causes the two electrodes to contact. The problem is particularly acute in D.C. (direct current) systems compared to A.C. (alternating current) systems.

In moving the electrodes, instability theoretically occurs in parallel plate capacitor structures when the movably suspended plate has traveled one third of the potential range of motion (typ. equal to the height of the air gap). In stressed metal systems, as described in the previously cited patent application, the cantilevers are typically 'curled'—as opposed to more typical 'straight' cantilevers. However, such instability usually occurs when the actuation electrode is placed underneath the cantilever and the cantilever moves approximately beyond one-third of its potential range of motion.

Various solutions have been proposed to correct the potential for suspended electrodes and the corresponding supports structures to "snap-down". These solutions include the following: using charge drives (see Seeger, et. al, "Dynamics and control of parallel-plate actuators beyond the electrostatic instability", Proc. Transducers '99, Sendai), adding capacitive elements in series (Seeger, et. al, "Stabilization of Electrostatically Actuated Mechanical Devices", Proc. Transducers '97, Chicago) or creating closed-loop feedback systems using capacitive, piezoresistive or optical detectors (Fujita "MEMS: Application to Optical Communication", Proc. of SPIE, '01, San Francisco). These methods extend the stable range of motion to varying degrees. However all these methods complicate fabrication of the cantilever and actuator mechanism thereby increasing fabrication costs and reducing reliability. Thus an improved method of moving a cantilever through a wide range of motion while avoiding instabilities is needed.

SUMMARY OF THE INVENTION

An improved system for controlling electrostatic deflection of a support mechanism associated with a moving electrode is described. In the system, a fixed electrode formed on a substrate uses electrostatic forces to control the motion of a moveable electrode coupled to a support structure. In order to avoid the strong electrostatic attractions that occur when the moveable electrode comes in close proximity to the fixed electrode on the substrate, the electrodes are offset such that a substantial portion of the fixed electrode is adjacent to, rather than directly in the path of the moveable electrode's range of motion.

DETAILED DESCRIPTION

Figure 1:
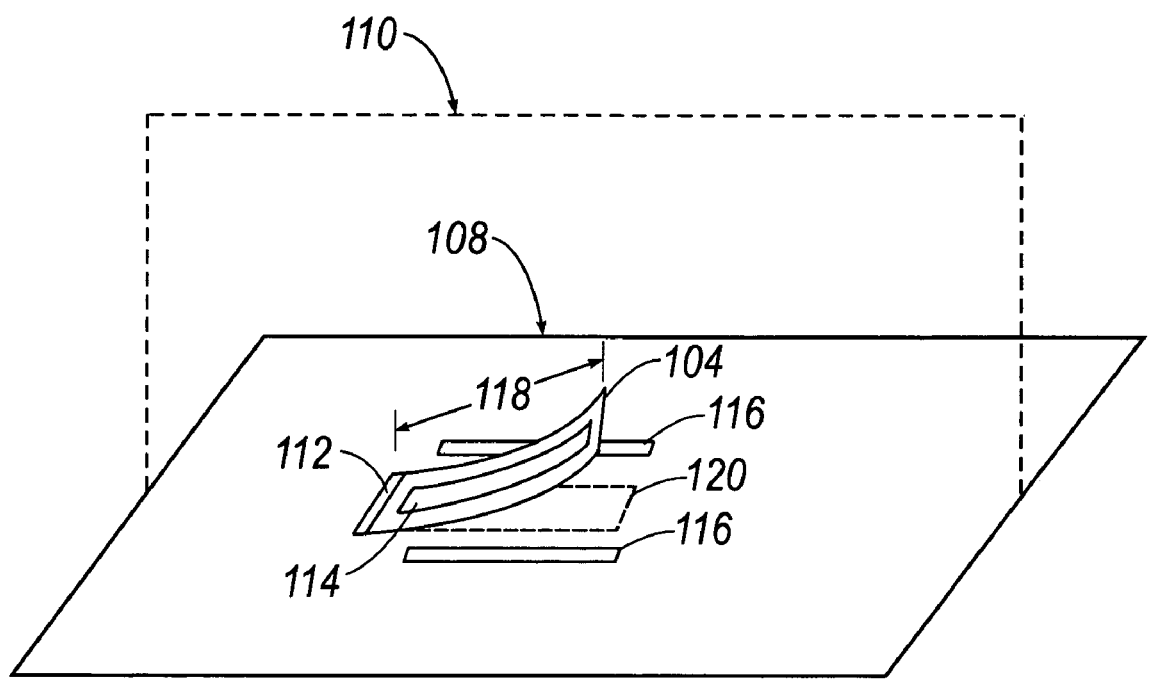
FIG. 1 shows a side view of a moveable electrode and a fixed electrode.
Figure 2:
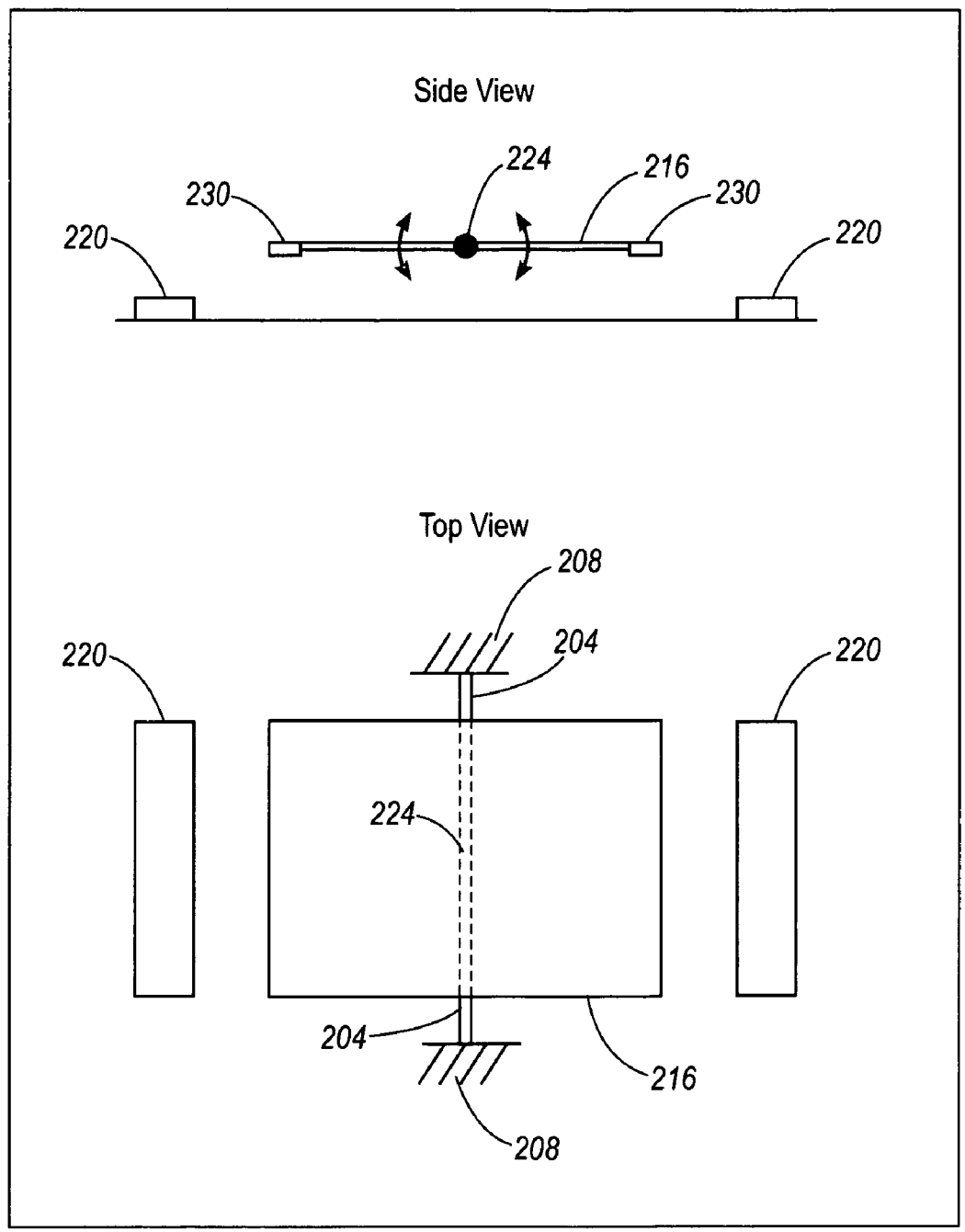
FIG. 2 shows a side and top view of a second support structure used to suspend a moveable electrode over a fixed electrode.

FIGS. 1 and 2 show two examples of MEMS cantilevered actuator structures. FIG. 1 shows a side view of a simple fixed end—free end cantilever-electrode structure. The example of the cantilever shown in FIG. 1 is a flexible cantilever that flexes upward and may be formed using techniques for forming stressy metal structures as described in U.S. Pat. No. 5,613,861 entitled "Photolithographically Patterned Spring Contact" which is hereby incorporated by reference. In FIG. 1, a flexible cantilever 104 is affixed to a substrate 108 at a fixed point 112. Typically, the cantilever is composed of or coated with an electrically conducting material to form a suspended moveable electrode 114 that facilitates the generation of electrostatic forces between moveable electrode 114 and a fixed electrode actuator. Examples of suitable materials for forming the cantilever include metal, silicon and polysilicon. In an alternate embodiment, the cantilever is a stressed metal to create the curve structure illustrated. Such stressy metal cantilevers may be formed from a refractory metal such as molybdenum, zirconium and/or tungsten (Mo, Zr, W).

Fixed electrode 116 deposited on substrate 108 controls movement of moveable electrode 114 and thereby cantilever 104. Moving electrode 114 moves in an arc in a motion plane 110, which in the illustrated example, is oriented perpendicular to the substrate surface (in the illustrated embodiment, the paper in which the drawing is drawn represents motion plane 110). When a voltage difference is applied between fixed electrode 116 and moving electrode 114, cantilever 104 moves towards fixed electrode 116. When moving electrode 114 is maximally displaced along a trajectory of motion in motion plane 110 such that moving electrode 114 is in the lateral plane of substrate 108, the position of the moving electrode is shown by outline 120. In FIG. 1, cantilever 104 flexes although in an alternate embodiment, a rigid cantilever may pivot around fixed point 112.

Cantilever 104 may be made of a variety of materials such as metal, silicon, polysilicon or other electrically conductive materials to serve as a moveable electrode. Alternatively, the cantilever may be made of an insulating material such as polymers, ceramics and the like, and subsequently coated with a conductive material such as a metal film, the conductive material coating serving as the moveable electrode. Appropriate dimensions of the cantilever are a length 118 of less than 5000 micrometers (less than 500 typical) and a width of less than 1000 micrometers (less than 100 typical) although alternate embodiments may use larger cantilevers.

In order to maintain control over the moving electrode and its associated support structure through a large range of motion, the fixed electrode is positioned such that it is laterally adjacent to, rather than directly underneath the cantilever. For purposes of discussion, "laterally adjacent" is defined as a position adjacent to the trajectory of the moving electrode such that even when the moving electrode is maximally displaced such that the moving electrode, in this case the cantilever, is in the lateral plane of the substrate, the two electrodes are adjacent in the plane of the substrate. In most cases, even when the moving electrode moves in an arc, the arc radiuses are small such that the moving in a trajectory is practically equivalent to translating the suspended electrode along a line perpendicular to the surface of the substrate supporting the fixed electrode. Once the two electrodes are in the plane of the substrate, "laterally adjacent" does not require or imply that the moving electrode and the fixed electrode are in contact, merely that the electrodes are close, typically separated by less than approximately 50 micrometers (e.g. 5 μm) when the moving electrode is in the lateral plane of the substrate. It is contemplated however, that the system may still operate when the electrodes are not entirely laterally adjacent, thus when small amounts of overlap result, typically less than 10 percent of the electrode surface are, fringe electric fields are the dominant source of attraction between the moving electrode and the fixed electrode and stability may still be archived.

Even when the cantilever is not displaced from its resting position, the distance from the fixed electrode to the moving electrode should be kept relatively small, for example less than 10 micrometers to allow the effects of electrostatic attraction to control movement of the cantilever in a reasonable voltage range (typically less than 200 volts). When the entire surface area of the electrode is laterally adjacent to rather than underneath the cantilever; direct contact between the cantilever and the electrode when the cantilever is at a maximum displacement is avoided thereby making an insulating layer over the fixed electrode unnecessary.

A side view of an alternative mechanism for suspending a moving electrode is shown in FIG. 2. The structure of FIG. 2 is a slight variation on what is typically called a Lucent mirror, Lucent mirrors have traditionally been used to redirect light in optical systems. In FIG. 2, a straight, torsionally flexible cantilever 204 is affixed to a substrate 208 at a fixed point 212 and affixed to a movably suspended member 216. Together, the elements represent a support structure for a moving electrode. In one embodiment of the invention, member 216 is composed of or coated with an electrically conducting material and thus also serves as the moveable electrode. The conducting material aids the generation of electrostatic forces between the moveable electrode and a fixed electrode 220 that serves as an electrode actuator. Examples of suitable materials from which to form the moveably suspended member include metal, silicon and polysilicon. Fixed Electrode 220 on substrate 208 controls movement of member 216. In the illustrated embodiment, member 216 rotates about an axis 224. Axis 224 is oriented parallel with the substrate surface. When a voltage difference is applied between fixed electrode 220 and a moving electrode associated with member 216, member 216 rotates towards the fixed electrode. In the illustrated embodiment, cantilever 204 flexes torsionally although in alternate embodiments the tortional flexing may be replaced by a rigid cantilever that pivots around fixed point 228.

Flexing cantilever 204 may be made of a variety of flexible materials such as metal, silicon, polysilicon. Appropriate dimensions of the cantilever are a length 232 of less than 5000 micrometers (less than 500 typical) and a width of less than 1000 micrometers (less than 100 typical) although alternate embodiments may use larger cantilevers. In order to maintain control over movements through a large range of motion, the fixed electrode is positioned such that it is laterally adjacent to, rather than directly underneath the moving electrode, in the illustrated example, suspended member 216 is formed from a conducting material and serves as the moving electrode. Even when the suspended member is not displaced from its resting position, the distance to the fixed electrode should be kept relatively small, for example less than 10-100 micrometers to allow the effects of electrostatic attraction to control movement of the cantilever in a reasonable voltage range (typically less than 200 volts). When the entire surface area of the electrode is laterally adjacent to rather than underneath the suspended member; direct contact between the cantilever and the electrode when the cantilever is at a maximum displacement is avoided thereby making an insulating layer over either electrode unnecessary.

In yet another variation of the structure shown in FIG. 2, voltage differences may be simultaneously applied between suspended member 216 and multiple fixed electrodes such as fixed electrode 220, thereby causing suspended member 105' to translate downward, towards the plane of the fixed electrodes. By keeping the forces approximately equal across the suspended member, rotational motion may be avoided. In this translational case, instability occurs at one third of the potential travel range when fixed electrodes 220 are placed directly underneath suspended the moving electrode represented by suspended member 216. Laterally offsetting the electrodes as shown in FIG. 2 substantially extends the stable range of motion beyond one third of the potential range, approaching the full potential travel range.

Figure 3:
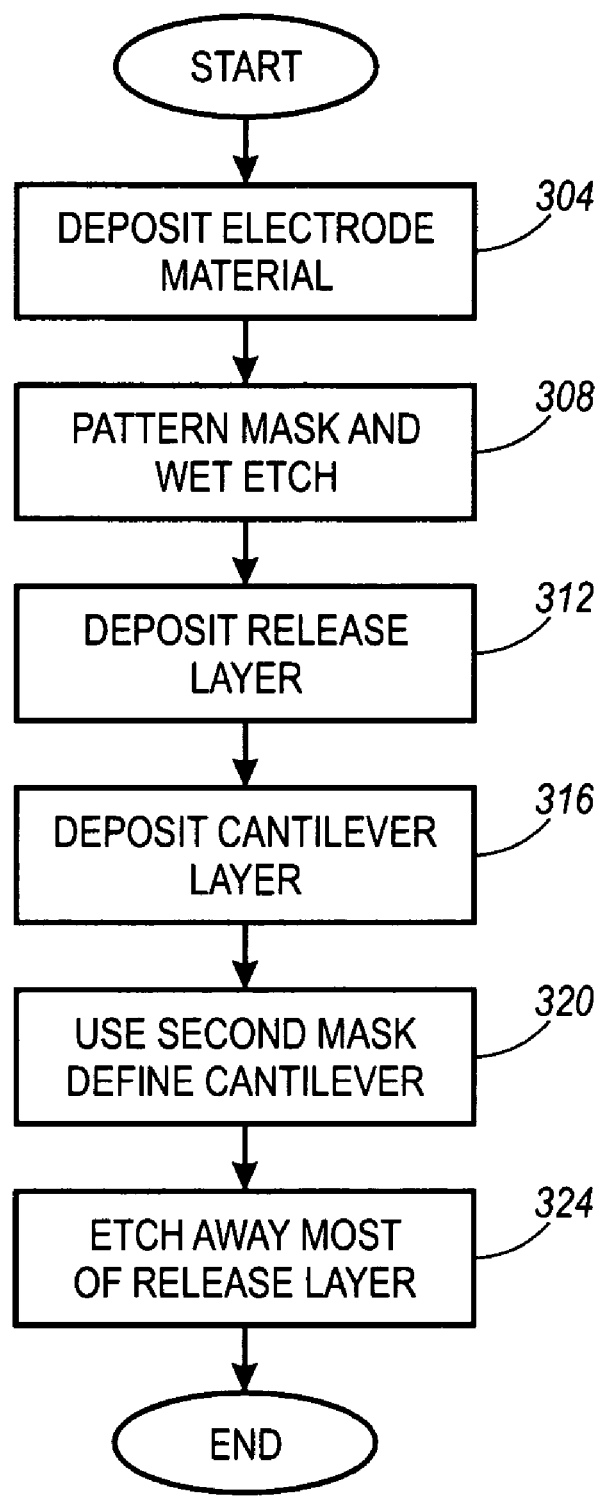
FIG. 3 is a flow chart showing one example method of forming a cantilever in a MEMS structure.

A number of methods exist to fabricate cantilever and actuator MEMS structures. FIG. 3 illustrates one method of fabricating the cantilever electrode structure using a three step semiconductor masking process. Although the process is described to enable one of ordinary skill in the art to fabricate a semiconductor cantilever, the invention should not be limited to the particular type of cantilever described nor the particular method used to fabricate the cantilever and electrode structures.

In operation 304 of FIG. 3, an electrode material is deposited on a substrate such as glass or quartz. The electrode material may be made from a number of conducting materials or metals such as chromium. After deposition, a pattern masking and wet etch is done in operation 308 to define the electrode and tracks or wires that couple the electrode to controlling circuitry. The controlling circuitry controls the charge and discharge of the electrode thereby controlling the motion of the cantilever. The thickness of the electrode may be tuned to obtain a sheet resistance suitable for resistive sensing. Chromium has a resistivity of about 130×109 Ohms/M, thus a thin film of 25 nm results in about 5 ohms/square.

In operation 312, a release layer, such as an amorphous silicon release layer is deposited. Typically, the release layer thickness determines the spacing between the cantilever and the substrate surface. The release layer is often slightly thicker than the electrode layer. The release layer serves as a buffer layer to prevent the entire subsequent cantilever layer from adhering to the substrate. A cantilever layer, such as a Molybdenum chromium (MoCr) layer is deposited in a blanket coat over the release layer in operation 316. A typical cantilever thickness is approximately 1 micrometer. When a stressed metal cantilever is desired, a stressed metal deposition is used to deposit the cantilever layer.

In operation 320, a second mask layer is used to define the cantilever shape by etching away the excess MoCr. In operation 324, the release layer is etched to release the cantilever leaving only one end of the cantilever affixed directly to the substrate. A typical method for etching a silicon release layer utilizes a dry etch of XeF2 as the etchant. When using other release layer materials, such as for example silicon oxide, a wet etch (e.g hydrofluoric acid) is typically used to remove the sacrificial layer.

Figure 4:
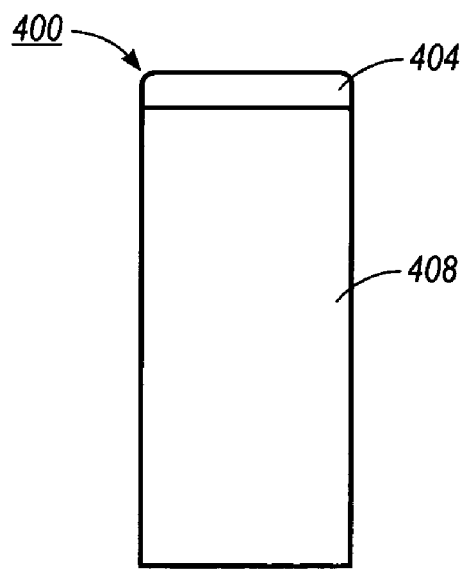
FIG. 4 shows a top view of a traditional placement of electrodes with respect to the cantilever.

FIGS. 4, 5, 6 and 7 are top views of the fixed electrode and a moving electrode cantilever structure that show alternate positions of the electrodes with respect to the cantilever. FIG. 4 shows a top view of a traditional cantilever over electrode structure. At contact area 404, the cantilever is fixed to an underlying substrate, either directly or through an intermediate layer. The flexing region 408 of the cantilever rests directly over an electrode underneath which controls movement of the cantilever. The close proximity and direct application of force by electrodes positioned underneath the cantilever minimizes the operational voltage needed to move the cantilever. However, the reduced power requirements come at the expense of great instability. Voltages greater than a critical voltage results in the cantilever "snapping" down towards the substrate.

Figure 5:
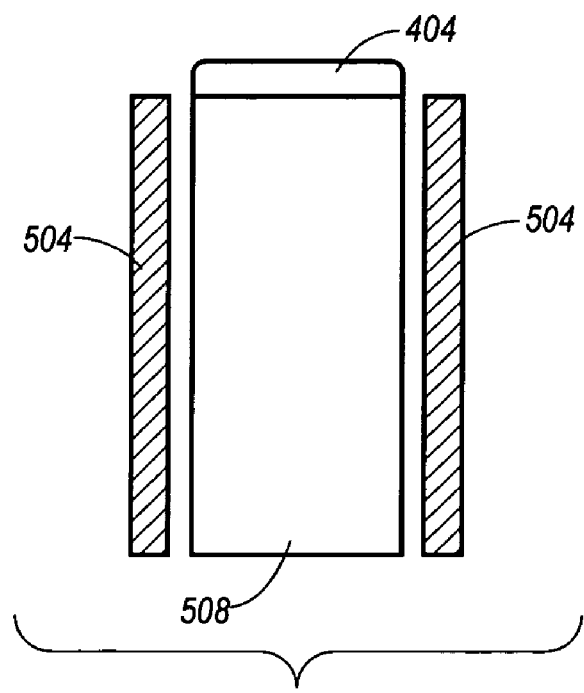
FIG. 5 shows a top view of one possible placement of rectangular electrodes with respect to the cantilever.

FIG. 5 shows one embodiment of the invention that utilizes rectangular strip electrodes 504 oriented with a length that runs parallel to the length of cantilever 508. Because electrodes 504 are not positioned directly underneath the cantilever, the laterally displaced rectangular strip electrodes depend on fringe electric fields to pull the cantilever downward. As the cantilever moves downward towards the substrate, the force vector of the electric field between the cantilever and the electrode increasingly points in a lateral direction (in the plane of the substrate) rather than in a downward direction towards the substrate. Thus, although the intensity or absolute value of the electric field increases as the cantilever moves toward the substrate, a greater percentage of the force is applied in a lateral direction reducing the rapid increase in electric field strength downward. A symmetrical arrangement of electrodes around the cantilever causes the lateral force components to cancel thereby minimizing displacement of the cantilever in a lateral direction.

Figure 6:
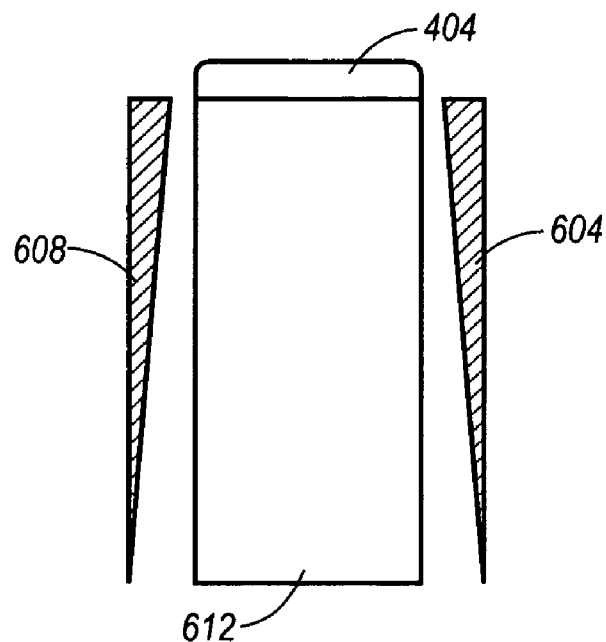
FIG. 6 shows a top view of one possible placement of triangular electrodes with respect to the cantilever.

To further increase the stable range of motion, triangular electrodes 604, 608 may be substituted for the rectangular electrodes as shown in FIG. 6. In this embodiment, the distance between the cantilever and the fixed electrodes increases along the length of the cantilever. The increasing distance between the cantilever and the fixed electrode further reduces the force for a given voltage along the length of the cantilever further increasing the stable range of motion. The embodiment of FIG. 6 requires the highest voltages compared to the structures shown in FIG. 5 and FIG. 6 to achieve an equivalent displacement of the cantilever, although the actual voltage required depends on many factors including cantilever and electrode geometries, dimensions of the cantilever, material properties, etc. A typical voltage to achieve a large displacement of cantilever 612 may be approximately 150 volts. Because the triangular electrodes also provide a fairly constant balance between applied force on the cantilever and cantilever flexibility across the length of the cantilever, the configuration illustrated in FIG. 6 provides the most stable configuration.

The triangular electrodes shown in FIG. 6 results in a spacing between the cantilever and the edge of the electrode remaining fairly linear with respect to voltage applied to the electrodes. In general, stability of the system is increased when the moving and/or fixed electrode is shaped such that the distance between the closest point on the fixed electrode and the closest point on the moving electrode increases with distance from the point at which the support structure supporting the moving electrode is coupled to the substrate. Various ways of accomplishing the gradually increasing distance include forming triangular fixed electrodes, forming triangular moving electrodes, or angularly orienting rectangular fixed and moving electrodes such that the space between the edges of the electrodes form a triangle. Other embodiments of the invention may also use electrodes with other tapered geometries (e.g. curved as opposed to straight). These different configurations may be used to linearize or otherwise tailor the displacement versus voltage curve.

Figure 7:
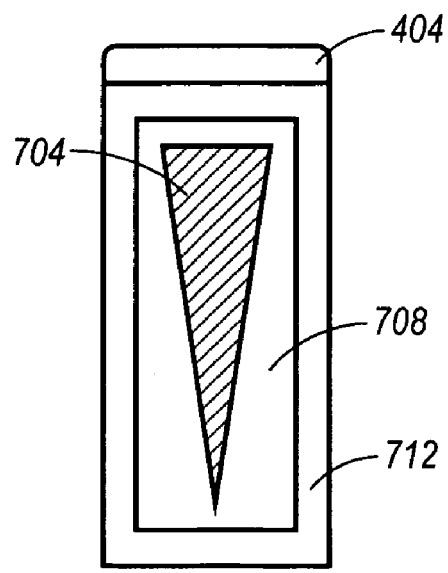
FIG. 7 shows a top view of a possible placement of a triangular or rectangular electrode with respect to a cantilever with a cutout area.

FIG. 7 shows an embodiment of the invention in which a tapered (or straight) fixed electrode 704 is formed underneath a cutout area 708 of cantilever 712. This and other types of 'cutout' cantilevers with 'internally adjacent' electrodes are based on the same concept as other laterally offset actuation electrodes, but may offer additional advantages. For example, the embodiment shown in FIG. 7 offers the advantages of adjacent electrodes while utilizing a minimum of area.

Figure 8:
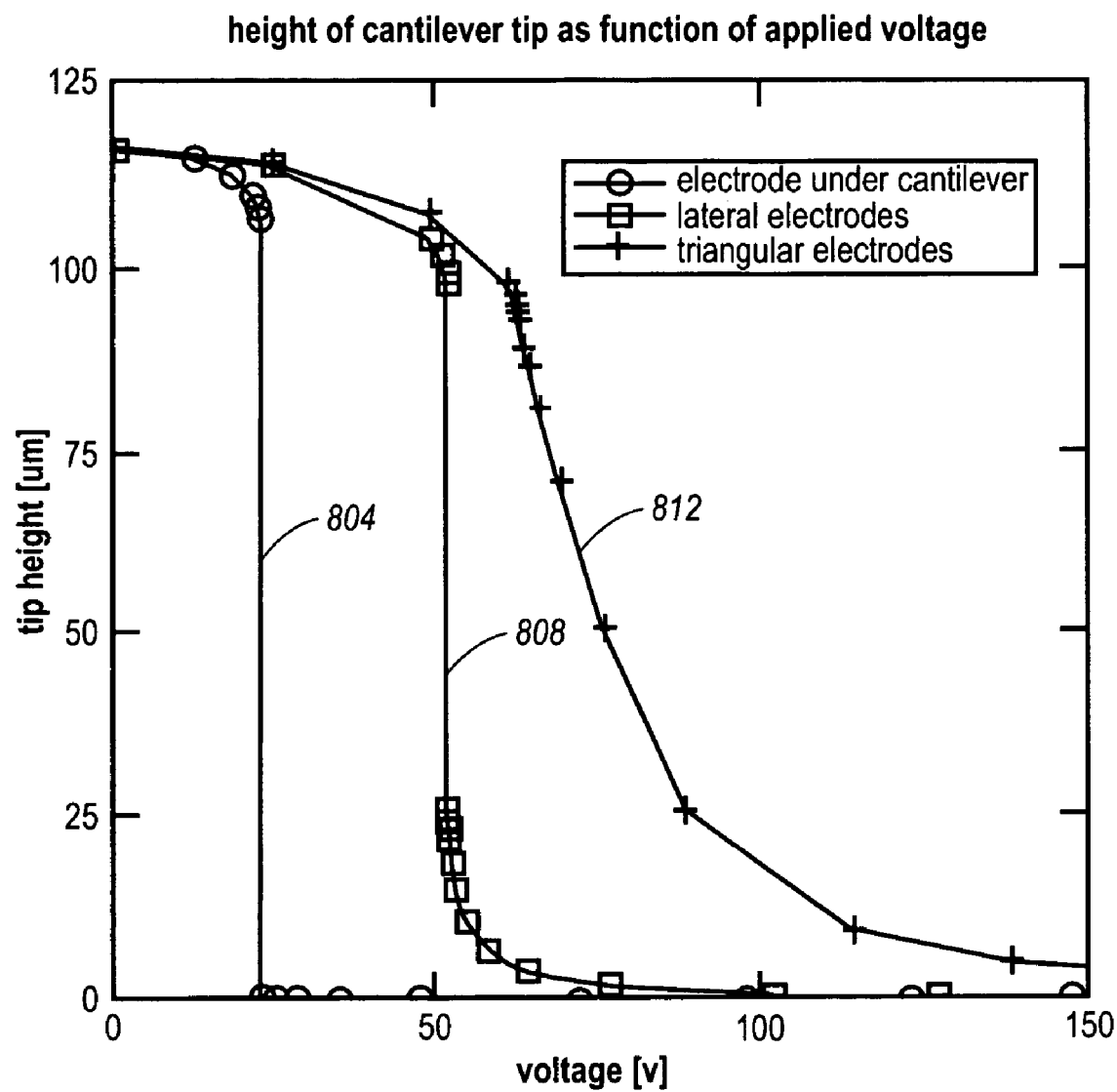
FIG. 8 is a graph showing a theoretical plot of cantilever height with respect to applied voltage for various electrode and cantilever structures.

FIG. 8 is a graph that shows the vertical height of a cantilever tip in micro-meters as a function of a direct current (D.C.) voltage applied to the electrode for different electrode geometries and positions based on a simple numerical model. Each line 804, 808 and 812 can be divided into two regions: (1) an actuation region in which an air gap exists between the cantilever and the substrate resulting in a nonzero cantilever tip height and (2) a critical voltage at which the cantilever "snaps" down to the substrate eliminating the gap between cantilever and substrate.

Line 804 shows the cantilever tip position as a function of electrode voltage for a traditional positioning of an electrode under the cantilever. In the model, the cantilever can only be controlled at a height displacement above approximately 110 micrometers. At approximately 20 volts, snap-down occurs after which manipulation of the cantilever over small displacements cannot be well controlled. When the electrode is placed under the cantilever, typically, the entire cantilever snaps down.

Line 808 shows a modeling of the cantilever height as a function of voltage for two rectangular parallel electrodes positioned adjacent to the cantilever as shown in the top view of FIG. 4. From line 808, it can be observed that the displacement of the cantilever can be well controlled for cantilever heights above 100 micro-meters. The cantilever snaps down at a critical voltage of approximately 55 volts.

Line 812 plots cantilever height as a function of voltage for two electrodes positioned laterally adjacent to the cantilever, the two electrodes shaped such that the electrode edges closest to the cantilever increases in distance from the cantilever edge as one moves along the length of the cantilever. Such a structure may be achieved by using triangular electrodes as was shown in FIG. 6, or by orienting straight lines electrodes such that they point slightly away from the cantilever edges. Comparing line 812 to lines 804 and 808, it can be seen that the actuation region for the laterally adjacent triangular electrodes is substantially larger than the actuation region for the electrode positioned underneath the cantilever and the rectangular electrodes positioned laterally adjacent to the cantilever. Thus the cantilever has a large actuation region allowing for control of the cantilever over a wide range of voltages and tip heights.

Figure 9:
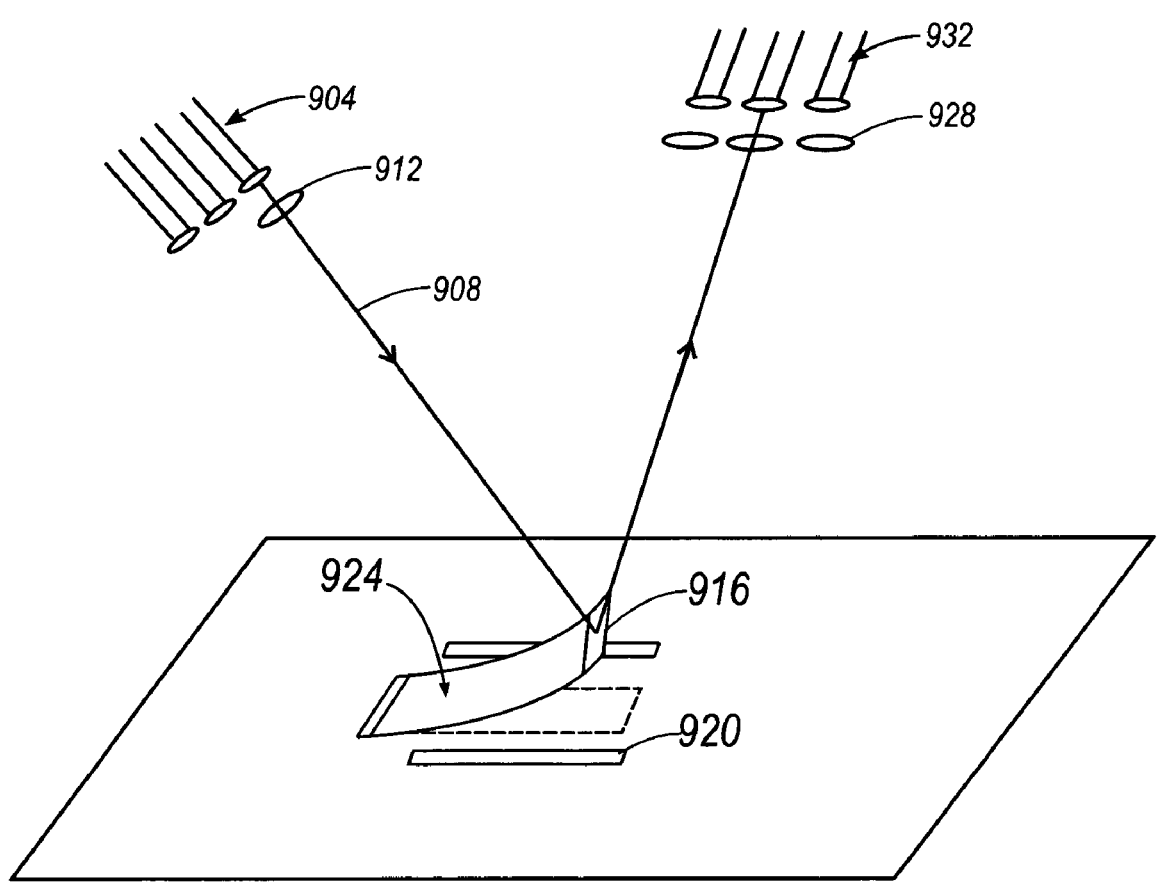
FIG. 9 shows a cantilever used in a optical switching system.

It should be understood that the foregoing described cantilevers may be used for a variety of structures, systems and applications, including but not limited to optical switching. FIG. 9 shows a simple cantilever used in a simplified optical switching system. In FIG. 9, an optical fiber 904 in an array of optical fibers acts as a light source that outputs a ray of light 908. The ray 908 is focused by a lens 912 and directed to a mirror 916. The position of mirror 916 is controlled by electrode 920 positioned laterally adjacent to cantilever 924. The orientation of mirror 916 determines which lens in receiving lens array 928 receives light. The receiving lens focuses the received light on a corresponding fiber in receiving fiber array 932.

In the illustrated embodiment of FIG. 9, mirror 916 positioned at the end of cantilever 924 offers movement in only one plane along an arc that represents the motion of a single cantilever. However, in array switching operations, it may be desirable to redirect light to various points in a two dimensional array.

Figure 10:
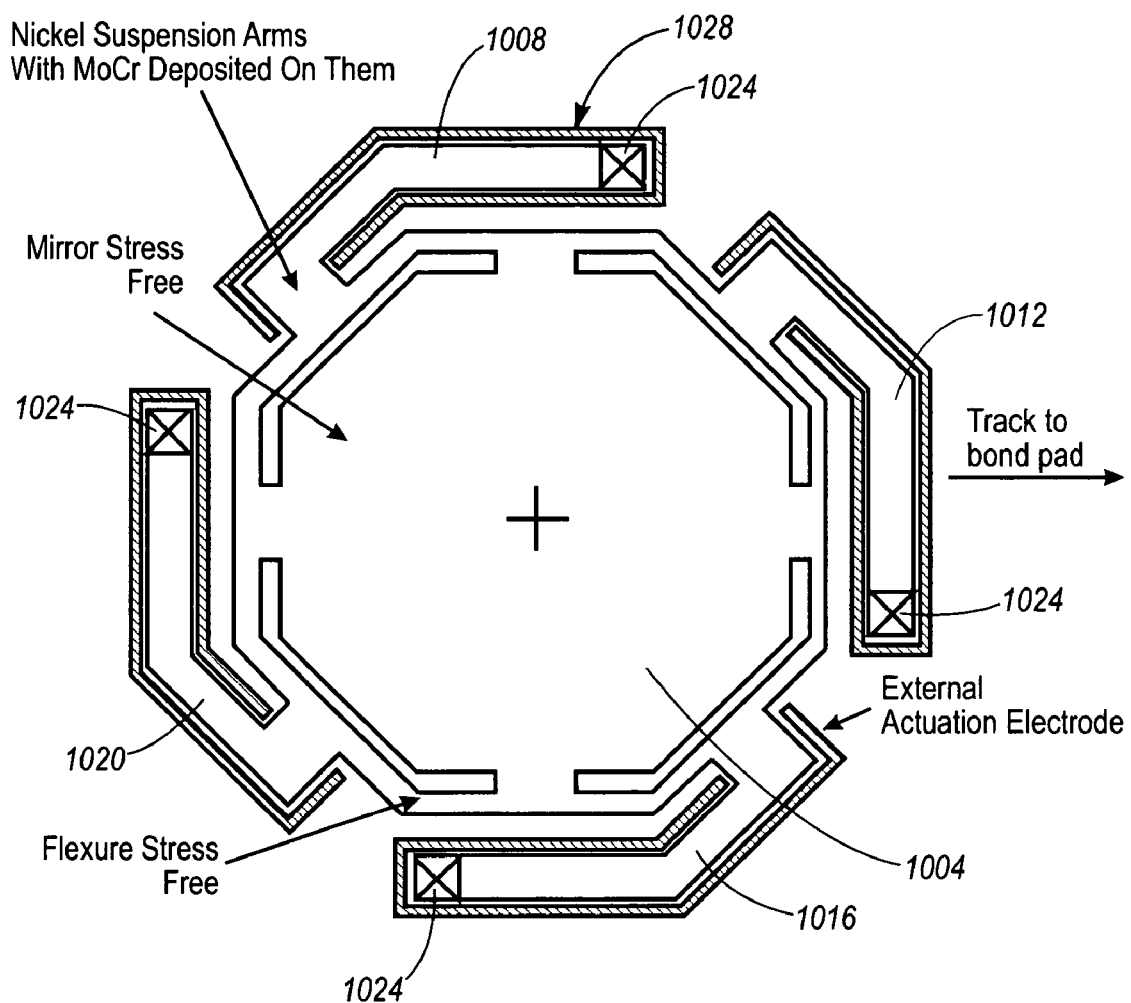
FIG. 10 shows a plurality of cantilevers coupled to a mirror to redirect an optical beam across a two dimensional area.

FIG. 10 shows a mirror region 1004 affixed to the end of a plurality of cantilevers 1008, 1012, 1016, and 1020. Each cantilever, such as cantilever 1008, includes a fixed end, such as fixed end 1024 affixed to an underlying substrate. Fixed electrodes, such as electrodes 1028 and electrode 1032 typically are formed on the underlying substrate and run along the perimeter of a corresponding cantilever. Each electrode, such as electrode 1028 can be considered laterally adjacent to the corresponding cantilever and may be used to deflect the corresponding cantilever. An end of cantilever 1008 opposite fixed end 1024 is coupled to mirror region 1004, thus as the cantilever moves up or down, the edge of the mirror coupled to the cantilever also moves up or down accordingly. The portion of the electrode near the fixed end such as fixed end 1024 serves mainly to couple the different sections of the electrode and keep the entire electrode at a fixed potential.

Other configurations of cantilevers and mirrors are also available as described in patent application Ser. Nos. 09/672,381 and 09/675,045 entitled "Method for an Optical Switch on a Silicon Substrate" and "Structure for an Optical Switch on a Substrate" respectively, both patent applications are hereby incorporated by reference. Control of the various mirror and cantilever configurations described in the references can be improved by placement of electrodes adjacent to the cantilevers.

The foregoing description includes a number of details that are provided to provide a clear understanding of the technology and the invention as well as to provide examples of different ways of using and/or implementing the technology. Details in the description such as dimensions, materials used to fabricate the device, and particular geometries should not be used to limit the invention. Likewise, it should be appreciated by those skilled in the art that other geometries and combinations are possible for suspension cantilevers and suspended structures, as well as for mechanical motions. It will also be appreciated by those skilled in the art that the presence of laterally offset electrodes does not preclude the presence of other, additional electrodes in any position or orientation, for any additional purpose (such as linearizing the deflection vs. voltage curve and the like). Thus, the invention should only be limited by the restrictions recited in the claims which follow.

What is claimed is:

1. A method of moving a moving electrode using electrostatic forces comprising:

applying a voltage such that a voltage difference is formed between a suspended moving electrode and a fixed electrode positioned laterally adjacent to the moving electrode, the fixed electrode in a first plane on a substrate surface, the applied voltage causing the moving electrode to move in a direction to reduce the distance between at least a portion of the moving electrode and a substrate surface to which a different portion of the moving electrode is coupled, the applied voltage to reduce a bend in the moving electrode thereby straightening the moving electrode, the applied voltage to also adjust the orientation of the moving electrode such that the angle formed between the moving electrode and the first plane is reduced.

2. The method of claim 1 wherein each electric field that electrostatically moves the moving electrode is a fringe electric field from the fixed electrode.

3. The method of claim 1 wherein at least ninety percent of the top surface of the fixed electrode extends beyond a surface covered by the moving electrode when the moving electrode moves into a plane approximately parallel with the substrate.

4. The method of claim 1 wherein the direction is downward towards the substrate surface.

5. The method of claim 1 wherein the moving electrode is mounted beneath the substrate and beneath the laterally adjacent electrodes and the direction is upwards towards the substrate surface.

6. A method of moving a moveable electrode comprising the operations of:
   applying a voltage to at least one electrode to create a difference in electric potential between a moveable electrode and a fixed electrode in a fixed electrode plane, the fixed electrode positioned laterally adjacent to the moveable electrode; and,
   adjusting the difference in electric potential to cause a reduction in curvature of the moveable electrode in a motion plane approximately perpendicular to the fixed electrode plane, the reduction in curvature of the moveable electrode reduces a distance between a portion of the moveable electrode and the fixed electrode plane.

7. The method of claim 6 wherein at least ninety percent of the fixed electrode extends beyond a surfaced covered by the moveable electrode when the moveable electrode moves approximately adjacent the fixed electrode plane.

8. The method of claim 6 wherein the moveable electrode is a cantilever wherein one end of the cantilever is mounted in the fixed electrode plane such that when all curvature is removed from the cantilever, the cantilever is in the fixed electrode plane.

9. The method of claim 6 wherein the difference in electric potential is between 30 and 100 volts.

10. The method of claim 6 wherein the moveable electrode includes a moveable tip, a gradual at least 75 percent decrease in electrode tip distance from the fixed electrode plane achievable over a gradual change in the difference in electric potential exceeding approximately 10 volts, whereas even at maximum voltage, the moveable tip does not contact the fixed electrode plane.

11. The method of claim 6 wherein the moveable electrode is triangular in shape.

12. The method of claim 6 wherein the electric potential changes the orientation of the moveable electrode to reduce an angle formed between the moveable electrode and the fixed electrode plane.

13. A method of reducing the curvature of a moveable electrode in a MicroElectroMechanical system comprising the operations of:
   determining a desired position of a moveable electrode;
   applying a voltage to at least one electrode of a moveable electrode and a fixed electrode to create a difference in electric potential between the moveable electrode and the fixed electrode, the fixed electrode in a fixed electrode plane, the fixed electrode positioned laterally adjacent to the moveable electrode; and,
   adjusting the difference in electric potential to cause movement and reduce a curvature of the moveable electrode in a motion plane approximately perpendicular to the fixed electrode surface such that the moveable electrode straightens such that the shortest distance between at least a portion of the moveable electrode and the fixed electrode plane is reduced, the difference in electric potential to also adjust the orientation of the moveable electrode such that the angle formed between the moveable electrode and the fixed electrode plane is reduced.

14. The method of claim 13 wherein the moveable electrode is a cantilever that includes a fixed end and a moveable tip.

15. The method of claim 13 wherein the desired position is determined by the height of the moveable tip.

16. A method of moving a moving electrode using electrostatic forces comprising:
   applying a voltage such that a voltage difference is formed between a suspended moving electrode and a fixed electrode positioned laterally adjacent to the moving electrode, the applied voltage causing the moving electrode to have less curvature and move in a direction to reduce the shortest distance between a tip of the moving electrode and a substrate to which a fixed end of the moving electrode is mounted, the voltage difference to change an orientation of the suspended moving electrode to reduce an angle between the substrate to which the fixed end of the moving electrode is mounted and the suspended moving electrode.

* * * * *